United States Patent
Dichtl (10) Patent No.: US 8,892,616 B2
(45) Date of Patent: Nov. 18, 2014

(54) DEVICE AND METHOD FOR GENERATING A RANDOM BIT SEQUENCE

(75) Inventor: Markus Dichtl, München (DE)

(73) Assignee: Siemens Aktiengesellschaft, Munich (DE)

( * ) Notice: Subject to any disclaimer, the term of this patent is extended or adjusted under 35 U.S.C. 154(b) by 810 days.

(21) Appl. No.: 12/733,428

(22) PCT Filed: Jul. 20, 2008

(86) PCT No.: PCT/EP2008/057846
§ 371 (c)(1),
(2), (4) Date: Mar. 1, 2010

(87) PCT Pub. No.: WO2009/027130
PCT Pub. Date: Mar. 5, 2009

(65) Prior Publication Data
US 2010/0211624 A1    Aug. 19, 2010

(30) Foreign Application Priority Data
Aug. 27, 2007   (DE) .......................... 10 2007 040 343

(51) Int. Cl.
*G06F 7/58* (2006.01)
*H03K 3/84* (2006.01)
*G07C 15/00* (2006.01)

(52) U.S. Cl.
CPC *G07C 15/00* (2013.01); *H03K 3/84* (2013.01); *G06F 7/588* (2013.01)
USPC ......................................................... 708/251

(58) Field of Classification Search
CPC ............ G06F 7/58; G06F 7/584; G06F 7/588
USPC ......................................... 708/250, 251, 255
See application file for complete search history.

(56) References Cited

U.S. PATENT DOCUMENTS 5,961,577 A * 10/1999 Soenen et al. ................ 708/251
6,065,029 A    5/2000 Weiss
(Continued)

FOREIGN PATENT DOCUMENTS

| DE | 10357782 B3 | 5/2005 |
|---|---|---|
| DE | 102005044084 A1 | 4/2006 |
| EP | 1803060 | 7/2007 |
| WO | WO 2006015624 A1 | 2/2006 |

OTHER PUBLICATIONS

Golic, "New Methods for Digital Generation and Postprocessing of Random Data", IEEE, 2006, pp. 1217-1229.*

(Continued)

*Primary Examiner* — Chuong D Ngo
(74) *Attorney, Agent, or Firm* — Staas & Halsey LLP (57) ABSTRACT

A device generates a random bit sequence with a digital ring oscillator circuit comprising logic components. The circuit has an input node and an output node, wherein the digital ring oscillator circuit is designed such that oscillation occurs during a change of state of a logic start signal coupled on the input node, said oscillation having a fixed point, and wherein on the output node a random signal can be tapped having an arbitrary level curve.

26 Claims, 6 Drawing Sheets

(56) References Cited

U.S. PATENT DOCUMENTS

| | | |
|---|---|---|
| 7,958,175 B2* | 6/2011 | Pomet et al. .................. 708/251 |
| 8,260,835 B2* | 9/2012 | Fukushima et al. .......... 708/251 |
| 2002/0120898 A1 | 8/2002 | Chen |
| 2004/0107230 A1 | 6/2004 | Bardouillet |
| 2004/0264233 A1 | 12/2004 | Fukushima |
| 2009/0106339 A1* | 4/2009 | Vasyltsov et al. ............. 708/251 |

OTHER PUBLICATIONS

Brar et al., "True Random Number Generators", IEEE, 2007, pp. 1-5.*

* cited by examiner

DEVICE AND METHOD FOR GENERATING A RANDOM BIT SEQUENCE

CROSS REFERENCE TO RELATED APPLICATIONS

This application is based on and hereby claims priority to PCT Application No. PCT/EP2008/057846 filed on Jun. 20, 2008 and DE Application No. 10 2007 040 343.9 filed on Aug. 27, 2007, the contents of which are hereby incorporated by reference.

BACKGROUND

The present invention relates to devices and methods for generating random bits and random bit sequences.

Random numbers, which occur in digital form as random bit sequences, are frequently required in security-related applications. It is necessary for example, with asymmetrical authentication methods, to generate and use random numbers. In particular with increasingly used RFID tags corresponding random numbers have to be generated with particularly minor hardware outlay. It is desirable here to use only digital logic circuits, which can be implemented in a manner that is favorable in respect of outlay.

In the past random number generators were used for example using analog noise sources, the signals of which are digitized. Hybrid analog/digital circuits can however only be implemented with significant outlay.

A random number generator, which has practically only digital logic circuits, is described in WO 2006/015624 A1. In this international patent application it is proposed that random phase fluctuations of ring oscillators made up of digital gates should be used. According to WO 2006/015624 A1 however only very specific ring oscillators, namely Fibonacci or Galois ring oscillators with particular characteristics, are suitable for use in a random number generator. With a circuit of such structure it is assumed that the ring oscillators cannot have fixed points. In particular for Fibonacci or Galois oscillator circuits this condition can be represented by mathematical equations, which have to be satisfied according to WO 2006/015624 A1. During corresponding implementation it should therefore be checked first whether a ring oscillator has fixed points. The selection from possible oscillator circuits is therefore disadvantageously very limited.

SUMMARY

One potential object is therefore to create an improved device for generating random bits.

The inventor proposes a device for generating a random bit sequence, which has a digital ring oscillator circuit with logic components. The ring oscillator circuit has an input node and an output node and is embodied such that oscillation starts when a logic start signal coupled to the input node changes state. The oscillation can reach a fixed point. In this process a random signal with a random level curve can be tapped at the output node of the ring oscillator circuit.

A fixed point in the following means that the logic components of the ring oscillator circuit assume a stable logic state. This does not necessarily have to be assumed during operation of the device for generating a random number sequence. The ring oscillator circuit is however embodied such that a stable fixed point exists in principle. The presence of a corresponding fixed point can be determined mathematically for example. These are preferably clearly defined logic states of the components and not metastable states, in which no oscillation of the ring oscillator occurs but the respective internal potentials remain at a level which is between the potentials assigned to the logic levels.

Thermal or quantum mechanical processes within the semiconductor components used to implement the oscillator cause for example phase fluctuations or jitter, which produce random internal signal or potential curves. The logic components, for example an odd number of inverter circuits, can be coupled to a ring in a cascaded manner for example to form a ring oscillator, the odd number of inverter circuits allowing oscillation. The oscillation frequency is generally a function of the inverter or logic circuits used. Differently occurring delays during signal processing due to the individual logic components mean that a jitter is established rather than a constant phase.

It is assumed that the reaching of a fixed point of the ring oscillator circuit is not detrimental to the random jitter occurring at least in the initial period of the oscillation. Every ring oscillator circuit has random temporal level curves in its signal curve after its activation or start-up. This is taken into account in order for example to determine the logic level of a random bit.

The device for generating a random bit sequence in particular has the advantage that it is simple to implement and calculations, as required for example in the related art to exclude a fixed point, do not have to be carried out. Therefore a larger class of oscillators can be used as ring oscillator circuits. Galois or Fibonacci ring oscillators can of course also be used here. Ring oscillators with fixed points also have the advantage that when the fixed point is reached, which with the proposed device for generating a random bit sequence is not detrimental to the quality of randomness, energy consumption is significantly reduced. This applies in particular when the corresponding circuit arrangements are implemented in CMOS technology.

The implementation, which is particularly favorable in respect of outlay and which preferably has only digital components, makes realization in the manner of an FPGA circuit particularly favorable. FPGA here refers to programmable integrated circuits in digital technology. FPGAs can be programmed "in the field" by a configuration of internal structures, which can form logic gates (FPGA=Field Programmable Gate Array). Of course the corresponding device for generating random numbers can also be embodied as an application-specific integrated circuit (ASIC=Application Specific Integrated Circuit), for example in CMOS.

In one embodiment of the device a buffer element coupled to the output node is provided, which stores a logic level as a function of the random signal.

It is possible for example to configure a buffer element as a flip flop, which changes its internal stored state when it passes a predeterminable logic threshold value. Known flip flops change for example the internally stored logic state with every rising or falling signal edge of the injected random signal. In other words if the random signal fluctuates irregularly between two logic levels, the buffer element supplies a random bit value, which is a function of the undeterminable number of for example rising or falling edges of the random signal. For example the buffer element can store a logic level corresponding to the random signal.

It is possible here for the buffer element, for example a flip flop, to store a logic level corresponding to the random signal as a function of a sampling signal. A sampling signal, for example an external clock signal, means that the level of the random signal is captured by the buffer element at certain times and is either used as a random bit or produces inversion of the stored logic level in the buffer element.

Regular sampling of the random signal, for example with a D flip flop, in particular in a time period before the ring oscillator potentially reaches a stable fixed point, means that the random level curve of the random signal is sufficient to achieve random distribution of the captured random bits.

The sampling signal generation facility is preferably embodied such that the sampling signal has a plurality of changes of state within a predetermined time period. The predetermined time period corresponds for example to a mean oscillation period. The fixed point generally occurs after a previous oscillation period. The distribution of these oscillation periods of a ring oscillator can for example be determined by measurement. The predetermined time period is preferably selected such that a substantial proportion of the oscillations take place within the time period.

According to one embodiment a sampling signal generation facility generates a plurality of changes of state for a sampling signal, so that the random signal is captured a plurality of times at the output node within the mean oscillation time. The ring oscillator circuit is preferably adjusted such that it is not activated from a fixed point and thus does not demonstrate temporally unpredictable, in other words randomized, level curves during the mean oscillation time. Random bits can thus be determined by periodic sampling of the random signal.

A corresponding start signal for restarting the ring oscillator can be supplied for example by a rectangular signal generation facility, which generates a start signal with changing logic levels. To this extent the ring oscillator circuit used is regularly restarted so that the risk of transient oscillation into a fixed point is reduced.

In one preferred embodiment of the device a control facility is provided, which prompts tapping of a random bit value at the output node or buffer element and/or the generation of the start signal according to programming for example. A realization of an actuation circuit is therefore conceivable, which always allows the generation of an individual random bit to be started from a same start state of the ring oscillator. When the ring oscillator is reset or restarted or reactivated from this start state and a further random bit is generated, there can preferably be a waiting period so that the ring oscillator circuit can relax or discharge.

A random bit sequence can in particular be generated by inverting a flip flop connected to the output node with each 0-1 passage of the random signal, in which process it is also possible to determine the random bits by periodic sampling of the buffered logic level of this flip flop. Even if the corresponding ring oscillator remains at a fixed point before sampling of the corresponding random bit value at the flip flop, this is not detrimental to the randomness of the buffered logic level or random bit value. The randomness here is taken into account adequately for example by the 0-1 passages previously taken into account. Other features, for example 1-0 passages, of the random signal can also be used.

In one development a random number generator is proposed with a device for generating a random bit sequence as described above. A plurality of tapped level values of the random signal or logic levels stored by a buffer element are captured here as bit values of a random number.

The inventor also proposes a method for generating a random bit sequence. Here random bit values are determined as a function of a level curve of a random signal tapped at a digital ring oscillator circuit. The digital ring oscillator circuit here has logic components, which are connected such that an oscillation is produced by activating the digital ring oscillator circuit. Due to the implementation of the ring oscillator this can in principle reach a fixed point, in which the logic components assume a stable logic state.

The corresponding method can be implemented for example by suitable programming of programmable digital logic circuits, for example FPGAs. Activation of the ring oscillator circuit can be achieved for example by switching on or coupling a suitable supply voltage to the corresponding circuit arrangement. Activation is also possible according to a respective implementation of the ring oscillator circuit by coupling a suitable control or start signal. Activation here refers to a process which results in an oscillation of the ring oscillator circuit, preferably starting from a predetermined start state of the logic gates used.

In one variant of the method the following steps are implemented: activation of a digital ring oscillator circuit, having a fixed point, and tapping of one or more level values of an oscillating random signal generated by the ring oscillator circuit.

The ring oscillator circuit can be activated a plurality of times here to generate a plurality of random bit values. This means that situations in which the ring oscillator has already reached its fixed point are taken into account for random bit sequence generation but the (regular) restarting of the circuit reduces the influence on randomness.

As already described above in respect of the device for generating a random bit sequence, the random signal can be sampled a plurality of times and a logic level of a random bit can be changed as a function of a respective level value of the random signal. This can be achieved for example by a buffer element as described above.

In a further variant of the method a mean oscillation time of the ring oscillator circuit is first determined, for example by experiment. This mean oscillation time, in which no oscillator fixed point probably occurs, can be used to capture the level of the random signal a plurality of times. To this extent a random bit sequence is captured reliably by the method even though, contrary to the widely held assumption that oscillators subject to a fixed point cannot be used for random number generation, such an oscillator is used.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Figure 1:
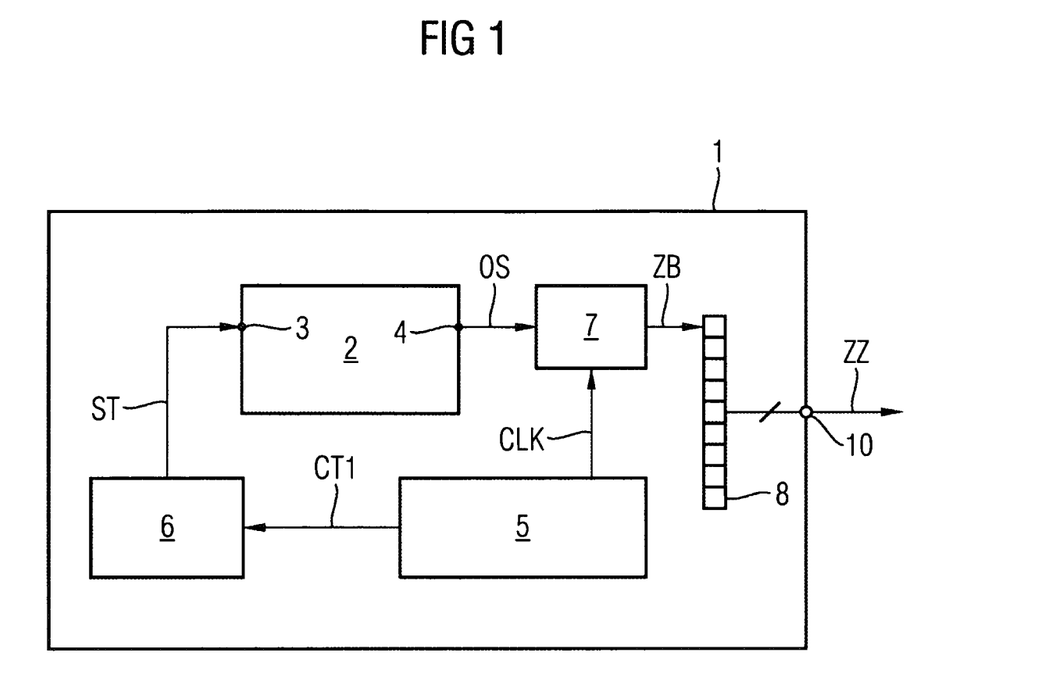
FIG. 1 shows an exemplary embodiment of a random number generator.

FIG. 1 shows an example of a random number generator 1. The random number generator 1 has a ring oscillator circuit 2 with an input node 3 and an output node 4. Exemplary embodiments of ring oscillators are described in more detail in FIGS. 2 and 3 below for example.

A ring oscillator can be realized for example by the cascaded connection of a plurality of inverters. Inverters or other logic components serve here as delay elements, with unpredictable fluctuations of the individual delay times producing unpredictable oscillation variations, so-called jitter. The delay fluctuations are generally due to different internal and external noise factors, for example the hardware implementation of the components and current, voltage and/or temperature fluctuations. In so far as it is true of inverters or logic gates that the delay time is extremely short, these unpredictable fluctuations produce random level curves of the in principle oscillating signal, which can be tapped at the output node 4 as the random signal OS.

The ring oscillator circuit 2 can be activated or started by a suitable start signal ST, which is injected at the input node 3. It is assumed here that the ring oscillator circuit 2 has a fixed point, in other words stable states exist, in which the logic components have logic states, which no longer change temporally. Until such a fixed point is reached however, a practically random change occurs to the corresponding tappable level.

The random signal OS is fed to a buffer element 7, e.g. a flip flop facility 7. The flip flop facility 7, for example a D flip flop, receives the random signal at a data input and supplies a buffered logic level as a random bit ZB at a data output. Since the random signal OS fluctuates over time and oscillates randomly, it is possible for example for the value of the random signal OS present at the sampling time, in other words for example when a rising or falling clock edge is present, to be captured or buffered by injecting a sampling signal, for example in the form of a clock signal CLK, at a clock input of the flip flop 7.

A corresponding sampling or clock signal CLK is supplied by a control facility 5 in the exemplary diagram in FIG. 1. The control facility 5 also generates suitable control signals CT1, to control a rectangular signal generator 6, which supplies the start signal ST to the input node 3 of the ring oscillator 2.

Various embodiments of operating modes of the random number generator 1 are possible. For example the random signal OS can be captured by the buffer element 7 at each sampling time, as described above, and output as a random bit ZB. This is input for example into a shift register 8. A random bit sequence is therefore present in the shift register 8 after a predetermined number of sampling times. Alternatively, even if not shown specifically in FIG. 1, the shift register can also be actuated by the clock signal CLK. A binary coded random number ZZ can then be tapped at an output 10 of the random number generator 1.

Alternatively the buffer element or flip flop 7 can also be embodied such that the internally stored value of the random bit ZB in the buffer element 7 is changed with every 0-1 or 1-0 passage of the random signal OS. The number of fluctuations or oscillations of the random signal OS is thus used as an additional random element for generating a random bit. The randomly generated level state in the buffer element is then output as a random bit ZB as a function of the sampling or clock signal CLK.

It is also possible to reset or restart the ring oscillator circuit 2 before each random bit generation, to reduce the risk of reaching a fixed point. It is preferably predetermined each time the ring oscillator circuit is reset or initialized that the start state, in other words the logic levels of all logic and digital components used in the ring oscillator circuit 2, does not correspond to that of a fixed point state.

Exemplary ring oscillator circuits, which in principle have fixed points and which are suitable for use in a device for generating a random bit sequence, are described in more detail below.

Figure 2:
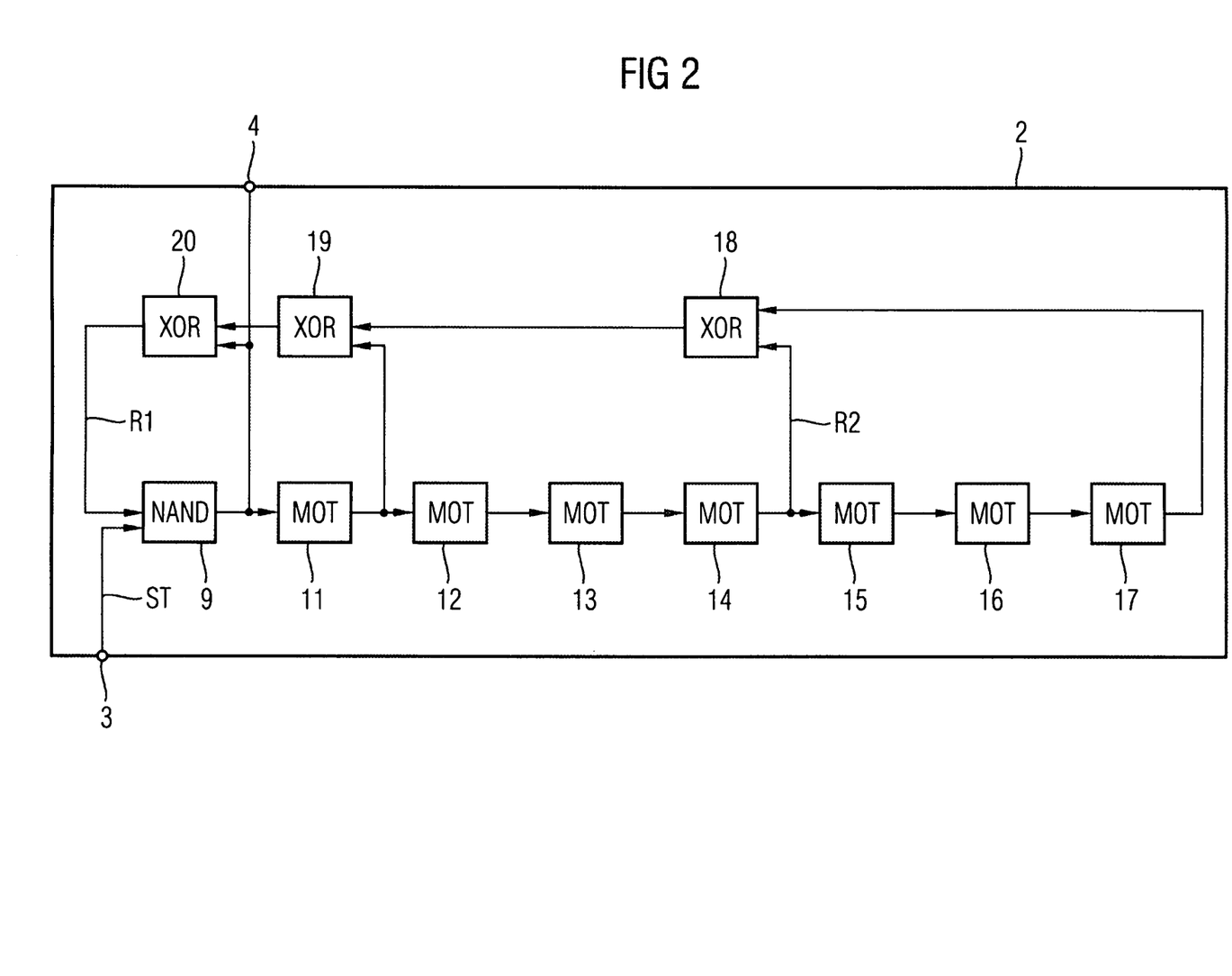
FIG. 2 shows a first embodiment of a ring oscillator circuit.

FIG. 2 shows a ring oscillator circuit 2. A delay section including seven inverters 11-17 is set up here, with a NAND gate connected upstream of it. The inverters are specified here as NAND gates in the circuit. The NAND gate 9 receives a start signal ST and feedback signal R1 as input variables. The output signal of the NAND gate 9 is fed here to an output node 4 of the ring oscillator circuit 2 and as an input variable to a XOR gate 20, which supplies the feedback signal R1 on the output side.

The output signal of the last inverter 17 is also fed to an input of an XOR gate 18, with a feedback signal R2, which corresponds to the output signal of the fourth inverter 14, also being supplied. The output signal of the first inverter 11 and the output signal of the XOR gate 18 are also fed to a further XOR gate 19. The XOR gate 20 forming the feedback signal R1 also receives the output signal from the further XOR gate 19. Generally a ring oscillator circuit results, which has only eleven logic gates and can be implemented particularly simply, e.g. in RFID chips or tags.

Figure 3:
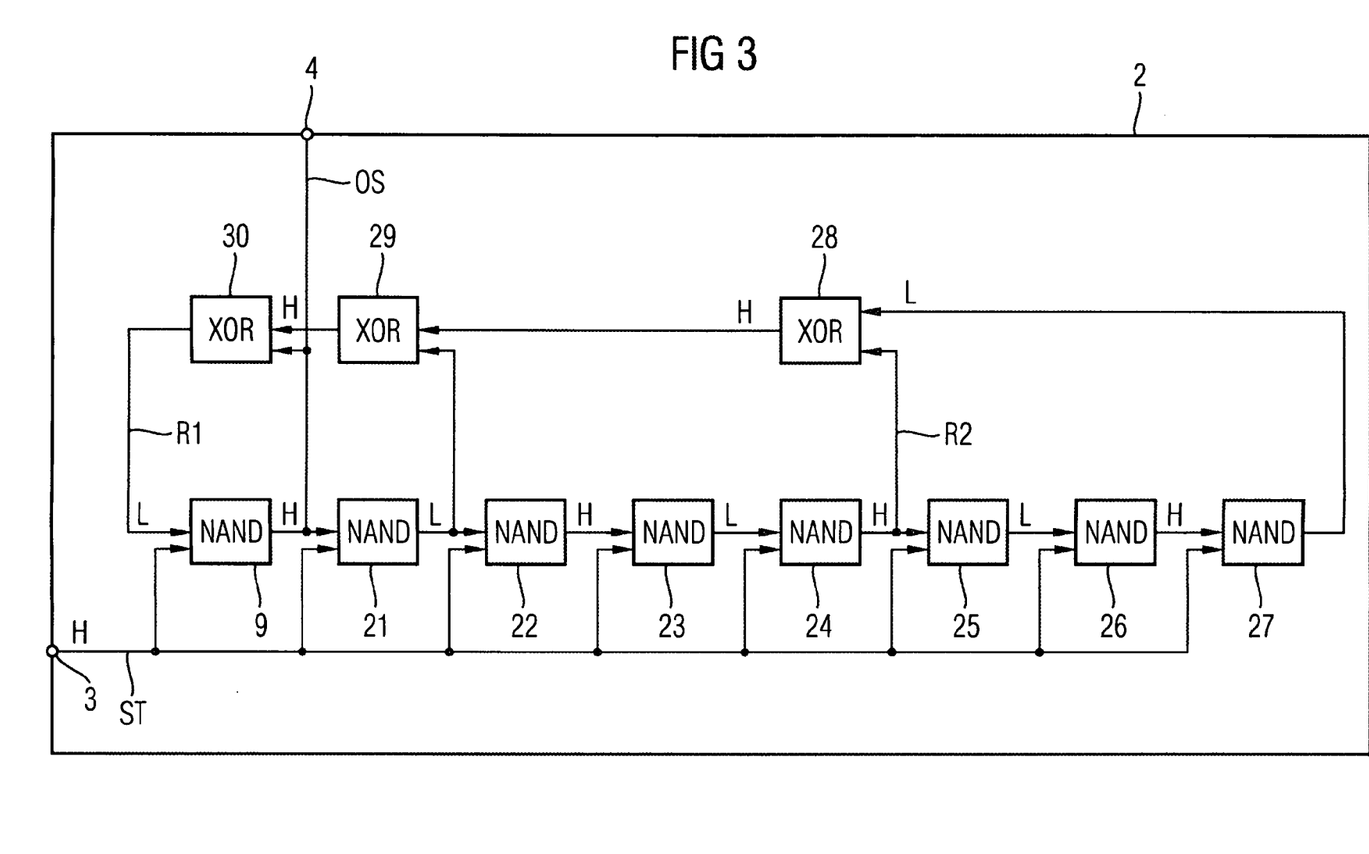
FIG. 3 shows a second embodiment of a ring oscillator circuit.

An alternative embodiment of a ring oscillator circuit is shown in FIG. 3. Essentially the same topology as in FIG. 2 is used here, but with the inverters 11-17 being replaced by NAND gates 21-27. The XOR gates corresponding to the XOR gates 18-20 in FIG. 2 are shown with reference characters 28-30 in FIG. 3.

A logic level 0 or low at the input node 3, for example in the form of a corresponding start signal ST, results in a deterministic state of the ring oscillator circuit 2 according to both FIG. 2 and FIG. 3. The oscillator circuit does not oscillate at ST=0. If 0 changes to 1, in other words there is a rising logic edge, in the start signal ST, the respective oscillator circuit or respective ring oscillator 2 starts an oscillation.

This oscillation lasts until a stable state of the respective circuit arrangement is reached. This can be a fixed point for example, in which the state assignment of the individual logic gates is stable and new oscillation can only be forced by restarting or resetting the individual logic levels of the gates. FIG. 3 shows the logic states in a fixed point H=1, L=0 at the outputs of the respective logic gates 9, 21-30 by way of example. Generally the fixed point is established, except in the situation where the fixed point is already present at the start of the ring oscillator 2, after a phase with random oscillations or with a random level curve at the output connection 4. The fixed point characteristics of the corresponding ring oscillator circuit 2 can be tested by experiment for example.

Figure 4:
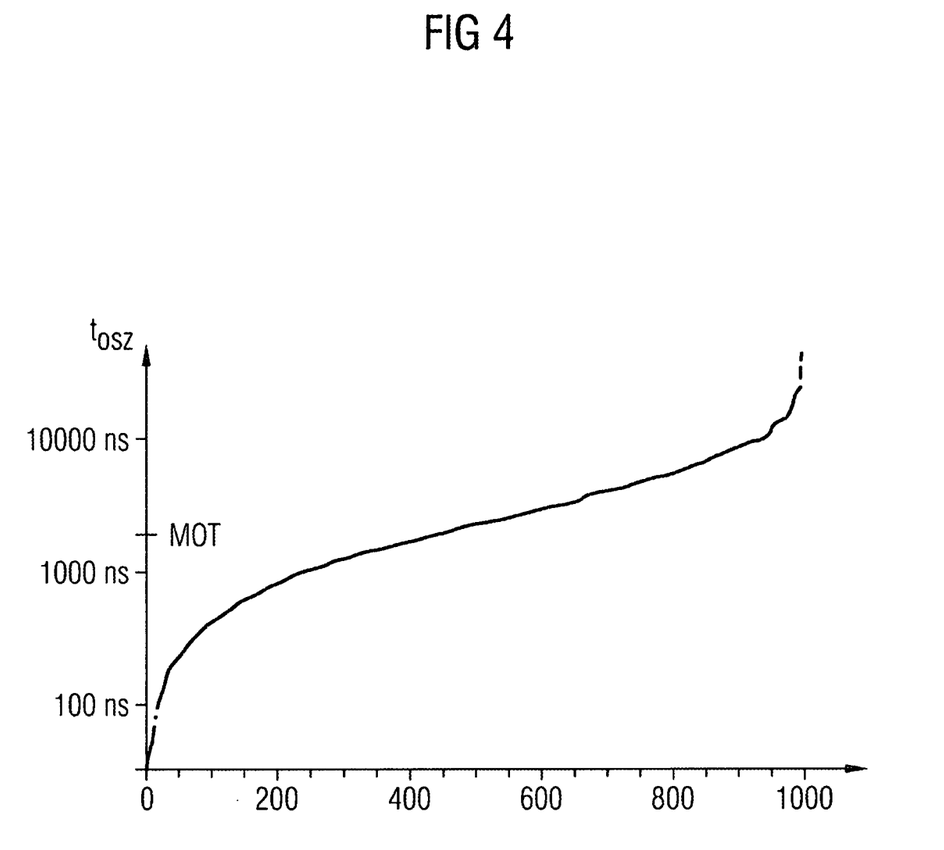
FIG. 4 shows a cumulative distribution of minimal oscillation times of a ring oscillator circuit.

FIG. 4 shows a graph of a cumulative distribution for times after which the ring oscillator reaches a fixed point for an implementation with the ring oscillator as shown in FIG. 3. The statistics shown in FIG. 4 are based on 1,000 restarts of the ring oscillator 2, as shown in FIG. 3, with the times after which the fixed point was reached, in other words a stable logic H level is tapped at the output node 4, being plotted on the y-axis. FIG. 4 shows the cumulative distribution of the corresponding times before a fixed point is reached after the restarting of the ring oscillator for 1,000 tests. The vertical axis here is plotted logarithmically.

A median of 2,277 ns and a mean value (MOT) for the times taken to reach the fixed point after 3,686 ns result for the ring oscillator shown in FIG. 3. When these times taken to reach the fixed point are determined by experiment, a time of less than 100 ns after the restart only results for 16 of 1,000 restarts. Despite the presence of a fixed point for the ring oscillators used in the random generator, it is thus practically excluded that just this fixed point or a corresponding logic level will be captured as a random bit. Taking into account the level curve until the fixed point, which is random, is reached in particular provides reliable random bit values.

Figure 5:
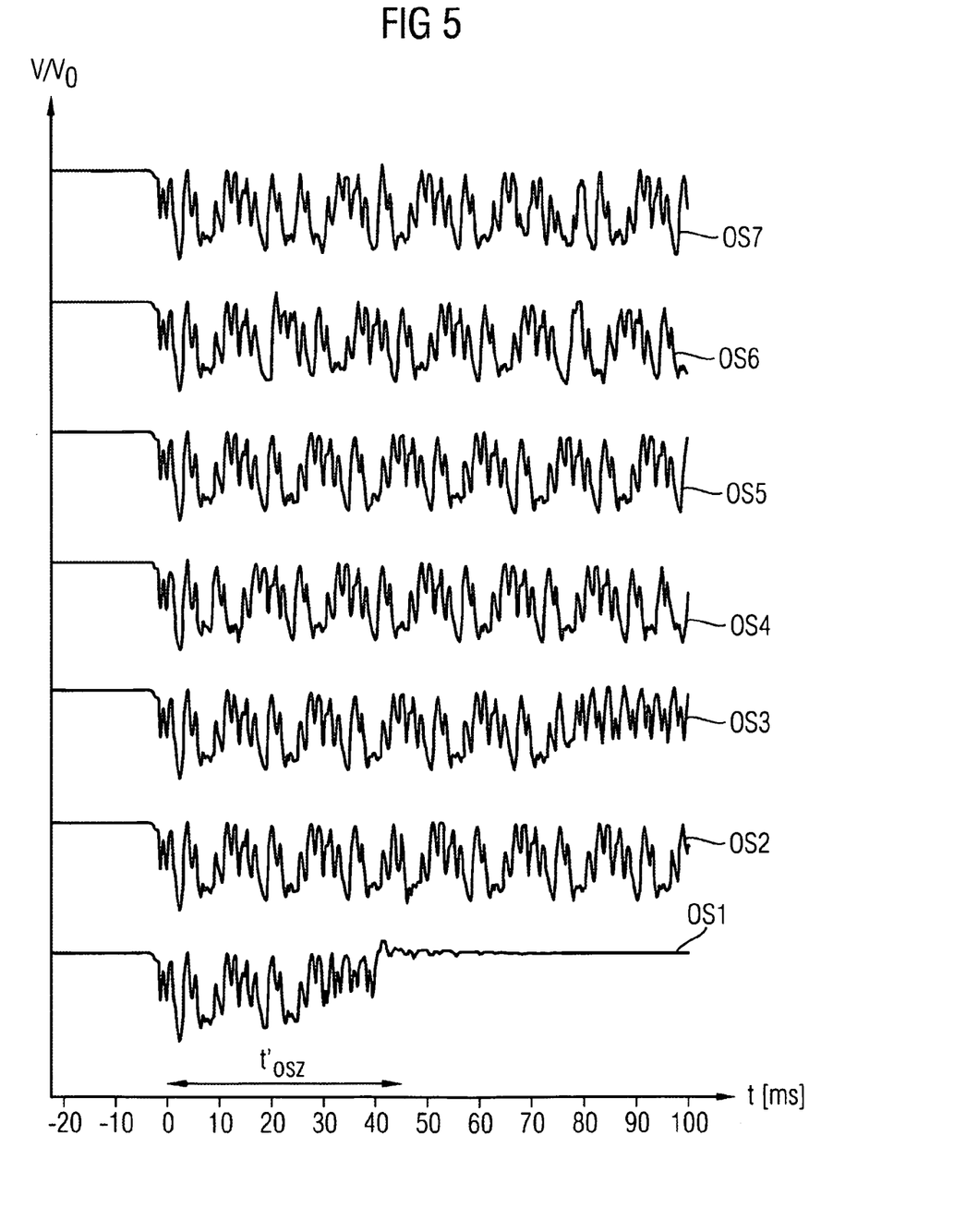
FIG. 5 shows exemplary random signal level curves of a ring oscillator circuit.

FIG. 5 by way of example shows level curves of the random signal OS, which can be tapped at the output node 4 of the ring oscillator shown in FIG. 3. The time in nanoseconds is shown on the x-axis and exemplary level curves OS1-OS7, which are standardized to a respective logic level value $V_0$, are shown on the y-axis. The various level curves OS1-OS7 are shown with some displacement from one another on the y-axis here.

At time t=0 the ring oscillator 2 is activated or started. This is done by switching the start signal ST from the logic L to the logic H level. The curves OS1-OS7 shown can be tapped for example with an oscilloscope at an output node 4.

The curve OS1 of the level curve for example shows the reaching of the fixed point, in other words a stable H level at the output node 4 after 50 ns. The other level curves OS2-OS7 selected by way of example in contrast show random oscillations in this time range. If it is determined for example by corresponding experimental data that the fixed point is not reached at least within a minimum oscillation time $t_{OSZ}'$, which can be indicated in FIG. 5 for example at around 42 ns, it is sufficient to take into account the level curve present within this time $t_{OSZ}'$ to determine a random bit. This can be done for example by sampling the output node 4 of the ring oscillator circuit directly after a predetermined time after the restart. This can also be done by way of a flip flop, as shown schematically in FIG. 1. Other time periods can also be used, for example a mean oscillation time MOT or the median of the distribution in FIG. 4. However a substantial proportion of the oscillations before a fixed point is reached should be taken into account for random but generation.

If the fixed point is always reached during direct sampling, the ring oscillator and sampling times are not suitable for generating random bits. However if the fixed point is frequently not always reached before sampling, the random generator or ring oscillator circuit generates statistically independent random bits. These random bits can have a skew, in other words the probability of tapping 0 or 1 is not 50%. However suitable algorithmic postprocessing allows such a skew to be compensated for to reach the fixed point. Methods and/or algorithms for example are known, which also compensate for a skew without knowledge of the specific statistical characteristics of the state distribution.

If a flip flop is used to capture or sample the random level curve, of the signals OS1-OS7 for example, an implementation is possible in which a change of state occurs in the buffered state of the flip flop with every rising edge of the signal OS1-OS7 for example. It is then irrelevant whether or not a fixed point is already reached when the buffer element or flip flop is read out.

It is also possible, at predetermined times or sampling times, which are predetermined by a clock signal, for a change of state of the logic level stored by the flip flop to take place as a function of the respective level present of the random signal. In this process the levels of the random signal should be taken into account, for example by sampling a plurality of times within the determinable mean oscillation period MOT.

In order to achieve the randomness characteristics or improve the skew, it is possible to reset the ring oscillator at regular intervals and allow it to rest for a predetermined time period. This is shown in FIG. 5 for example by the negative lead time lasting 20 ns until the start of the ring oscillator. If the ring oscillator is regularly restarted even when it has a fixed point, statistical dependencies of the random bits generated as a function of the random signal are impossible. Only a skew i.e. a deviation of the frequency of the 1 bits from the ideal value of probability ½ is possible. Experiments by the applicant however show that a probability of 0.4951 results for the bit value 1 or H for example for an implementation of the ring oscillator according to FIG. 3 in a random number generator. This is 604,398 of 1,220,703 generated random bits. A similar experiment gave a probability of 0.4966 for 1 bits for the ring oscillator circuit shown in FIG. 2. These minor skews generally satisfy all requirements and standard specifications for random number generators.

Figure 6:
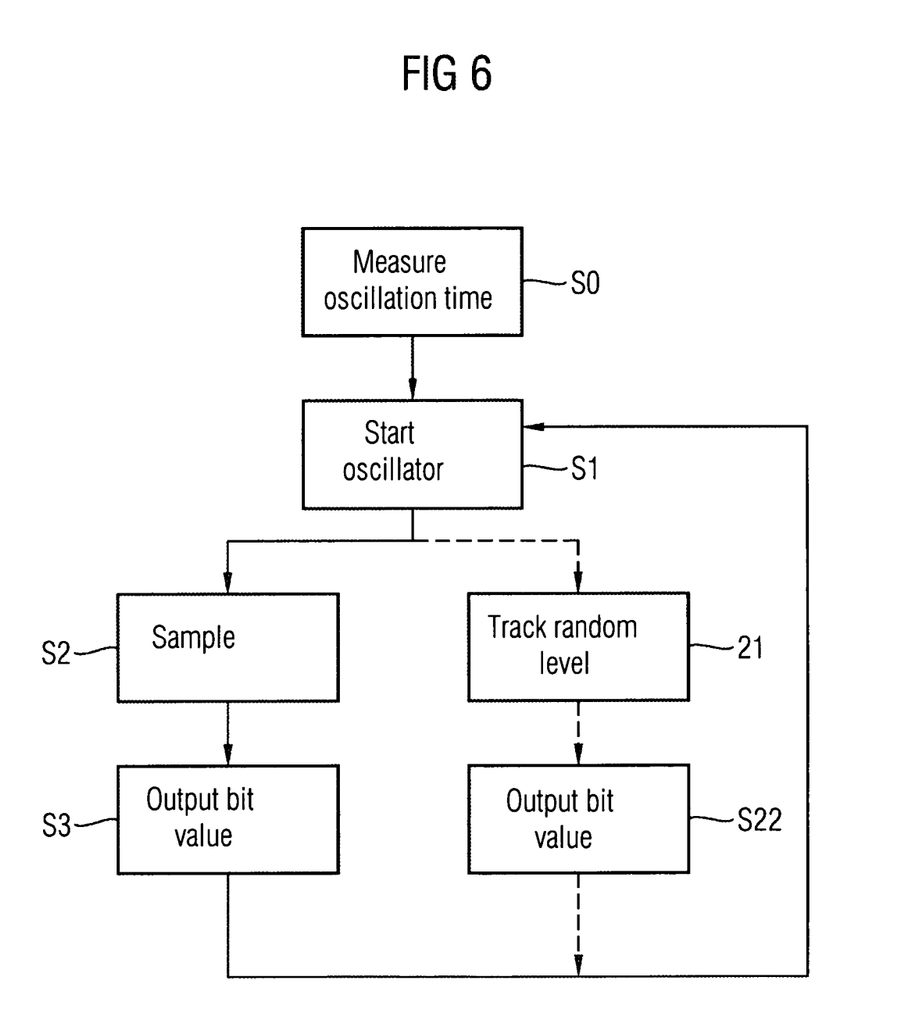
FIG. 6 shows a basic flow diagram of a method for generating random bit sequences.

FIG. 6 finally shows an exemplary flow diagram for a corresponding method for generating random bit sequences. Implementation is possible for example by suitable programming of control facilities, as shown in FIG. 1 with the reference character 5.

In a preparation step S0, which is optional, the oscillation time of the ring oscillator circuit used can be measured. The result is for example a mean oscillation time, in which the ring oscillator will probably not assume a fixed point.

The oscillator is started in step S1. In step S2 the oscillator signal or random signal is sampled, corresponding to a logic 1 or 0 level according to the captured level.

The corresponding bit value is output in step S3. An individual random bit is thus generated.

The oscillator is then restarted, so that further random bits are generated according to the loop of steps S1, S2, S3. The random bit sequence can then be interpreted for example as a binary code of a random number.

FIG. 6 also shows an alternative variant of the method for generating random bit sequences according to step S21 and S22, the flow arrows being shown with a broken line.

After the ring oscillator has started S1, the random levels, in other words the level curve of the random signal that can be captured by the ring oscillator, are tracked in step S21. Tracking can be done for example by regular sampling or injecting the random signal into a buffer facility, which changes a stored logic level as a function of rising or falling clock edges. After a for example predetermined time the bit value thus buffered is output in step S22. Further following of the steps S21, S22 in the manner of a program loop again produces random bit sequences.

The proposals in the form of the random number generators, ring oscillators and method sequences shown by way of example achieves a reliable generation of random numbers with extremely minor hardware outlay. The random bit sequences or random numbers achieve a high statistical quality and can be used for example in encryption methods or authentication algorithms, in particular also on RFID chips.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:

1. A device for generating a random bit sequence, comprising:
    an input node;
    a digital ring oscillator circuit to receive a logic start signal from the input node and to generate a random signal with a random curve level, wherein a randomness of the random curve level is produced by unpredictable oscillation variations of the digital ring oscillator circuit, the digital ring oscillator circuit having a fixed point and having logic components such that the digital ring oscillator circuit starts oscillating when the logic start signal changes state and reaches the fixed point; and an output node from which the random signal is tapped in a time period before the digital ring oscillator circuit reaches the fixed point.

2. The device as claimed in claim 1, further comprising a buffer element coupled to the output node, which stores a logic level as a function of the random signal.

3. The device as claimed in claim 2, wherein the buffer element stores a logic level corresponding to the random signal.

4. The device as claimed in claim 2, wherein the buffer element stores a logic level corresponding to the random signal as a function of a sampling signal.

5. The device as claimed in claim 4, further comprising a sampling signal generation unit, which generates a logic change of state of the sampling signal at predetermined times.

6. The device as claimed in claim 5, wherein the sampling signal generation unit causes a plurality of changes of state in the sampling signal within a predetermined time period.

7. The device as claimed in claim 4, wherein
the fixed point occurs after an oscillation period, and
the sampling signal generation unit causes the plurality of changes of state in the sampling signal within the oscillation period.

8. The device as claimed in claim 2, wherein the buffer element comprises a D flip flop circuit.

9. The device as claimed in claim 1, wherein
the start signal has changing logic levels and changes state, and
the device further comprises a rectangular signal generation unit coupled to the input node, to generate the start signal with changing logic levels.

10. The device as claimed in claim 9, wherein the rectangular signal generation unit causes a logic level change of the start signal at predetermined times.

11. The device as claimed in claim 1, further comprising a control unit, which prompts tapping of a random bit value from the output node and/or the generation of the start signal.

12. The device as claimed in claim 1, wherein the ring oscillator circuit has inverters connected in a cascaded manner.

13. The device as claimed in claim 1, wherein the ring oscillator circuit has logic circuits connected in a cascaded manner.

14. The device as claimed in claim 1, wherein the ring oscillator circuit is a Galois ring oscillator.

15. The device as claimed in claim 1, wherein the ring oscillator circuit is a Fibonacci ring oscillator.

16. The device as claimed in claim 1, wherein the device comprises a Field Programmable Gate Array (FPGA) circuit.

17. The device as claimed in claim 1, wherein the fixed point is a naturally occurring point at which the logic components of the ring oscillator circuit assume a stable logic state.

18. A random number generator comprising:
an input node;
a digital ring oscillator circuit to receive a logic start signal from the input node and to generate a random signal with a random curve level, wherein a randomness of the random curve level is produced by unpredictable oscillation variations of the digital ring oscillator circuit, the digital ring oscillator circuit having a fixed point and having logic components such that the digital ring oscillator circuit starts oscillating when the logic start signal changes state and reaches the fixed point;
an output node from which the random signal is tapped in a time period before the digital ring oscillator circuit reaches the fixed point; and
a device to capture a plurality of level values tapped from the output node, the level values being captured as bit values of a random number.

19. The random number generator as claimed in claim 18, wherein the fixed point is a naturally occurring point at which the logic components of the ring oscillator circuit assume a stable logic state.

20. A method for generating a random bit sequence, comprising:
activating a digital ring oscillator circuit by switching a state of a logic start signal provided to the digital ring oscillator circuit, the digital ring oscillator circuit having a fixed point and having logic components, which are connected such that activation of the ring oscillator circuit causes the digital ring oscillator circuit to start oscillating and reach the fixed point; and
determining random bit values as a function of a curve level of a random signal tapped at the digital ring oscillator circuit, wherein a randomness of the random curve is produced by unpredictable oscillation variations of the digital ring oscillator circuit, and wherein the random signal is tapped in a time period before the digital ring oscillator circuit reaches the fixed point.

21. The method as claimed in claim 20, wherein the random signal is an oscillating random signal.

22. The method as claimed in claim 20, wherein the ring oscillator circuit is activated a plurality of times to generate a plurality of random bit values.

23. The method as claimed in claim 20, wherein
the random signal is sampled a plurality of times for a plurality of respective random bits, and
each random bit has a logic level determined as a function of a respective level value of the random signal.

24. The method as claimed in claim 20, further comprising determining a mean oscillation time of the ring oscillator circuit.

25. The method as claimed in claim 24, wherein the curve level of the random signal is captured a plurality of times within the minimum mean oscillation time.

26. The method as claimed in claim 20, wherein the fixed point is a naturally occurring point at which the logic components of the ring oscillator circuit assume a stable logic state.

* * * * *

UNITED STATES PATENT AND TRADEMARK OFFICE
CERTIFICATE OF CORRECTION

PATENT NO. : 8,892,616 B2  
APPLICATION NO. : 12/733428  
DATED : November 18, 2014  
INVENTOR(S) : Markus Dichtl

Page 1 of 1

It is certified that error appears in the above-identified patent and that said Letters Patent is hereby corrected as shown below:

On the Title Page

Column 1, Item [22] (PCT Filed), Delete "Jul. 20, 2008" and insert -- Jun. 20, 2008 --, therefor.

Signed and Sealed this
Fifth Day of May, 2015

Michelle K. Lee
*Director of the United States Patent and Trademark Office*